United States Patent
Boniface et al.

(10) Patent No.: US 6,404,650 B1
(45) Date of Patent: Jun. 11, 2002

(54) SYSTEM FOR CONNECTING A MODULE COMPRISING A PLURALITY OF ELECTRONIC CARDS TO A BACKPLANE

(75) Inventors: Henri Boniface, La Gaude; Bruno Centola, Vence; Jean-Marc Legrand, La Gaude, all of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/457,462

(22) Filed: Dec. 8, 1999

(30) Foreign Application Priority Data

Dec. 11, 1998 (EP) .............................. 98480088

(51) Int. Cl.⁷ ................................ H05K 7/14
(52) U.S. Cl. ................ 361/796; 361/752; 361/758; 361/759; 361/801; 174/138 G; 211/41.17
(58) Field of Search ................. 361/752, 753, 361/758, 759, 796, 797, 801, 804; 174/52.1, 138 G; 211/41.17

(56) References Cited

U.S. PATENT DOCUMENTS 3,479,568 A * 11/1969 Shapiro et al. .............. 361/801
4,730,237 A * 3/1988 Locker ........................ 361/759
4,875,140 A * 10/1989 Delpech et al. ............. 361/804
5,390,083 A * 2/1995 Decker et al. ............... 361/796
5,477,420 A * 12/1995 Brooks ........................ 361/796
5,682,678 A * 11/1997 Gallagher et al. ........ 29/897.32

FOREIGN PATENT DOCUMENTS

RU    1564-742 A  *  5/1990
RU    1765914 A1  *  9/1992

* cited by examiner

Primary Examiner—Jayprakash N. Gandhi
(74) Attorney, Agent, or Firm—Scott W. Reid (57) ABSTRACT

A system is provided for positioning a plurality of cards in an electronic module intended to be plugged into a backplane. The system includes a spacing element comprising a succession of spacers of increasing section (diameter). Spacers are arranged end to end and are preferably cylindrical. The difference of section between successive spacers forms a kind of stair step or shoulder. These successive steps position the electronic cards parallel to one another, with a predetermined spacing which corresponds to the spacing of the backplane connectors. Fastening means, such as a nut, are associated with the steps for maintaining the cards. The cards are bored so that the spacing element can be inserted and the nuts applied. The size of the hole in each card is such that the surface around the hole can be pressed against the corresponding shoulder by means of the nut installed on the opposite side.

34 Claims, 5 Drawing Sheets

Alignement system according to present invention

SYSTEM FOR CONNECTING A MODULE COMPRISING A PLURALITY OF ELECTRONIC CARDS TO A BACKPLANE

TECHNICAL FIELD OF THE INVENTION

The present invention relates to modular electronic equipment such as computers or communication systems, which need to achieve a maximum of connectivity and more particularly, to a system for precisely positioning a plurality of electronic cards with the aim of plugging them into a backplane.

BACKGROUND ART

In most instances, large electronic systems are made of a set of electronic cards providing internal and peer to peer connection through a backplane. With the electronic technology progress, it is often interesting to enhance the performance and the function of an electronic system by adding cards. One or more daughter cards can be connected on a mother card or additional cards can be directly connected to the backplane. This process has been widely deployed across the industry to save development efforts and preserve customers investments. However, because the need of connecting additional cards to a backplane cannot always be foreseen during the design or installation phase, the upgrading of large electrical systems may lead to some mechanical problems in particular for mating cards and backplane connectors.

Figure 1:
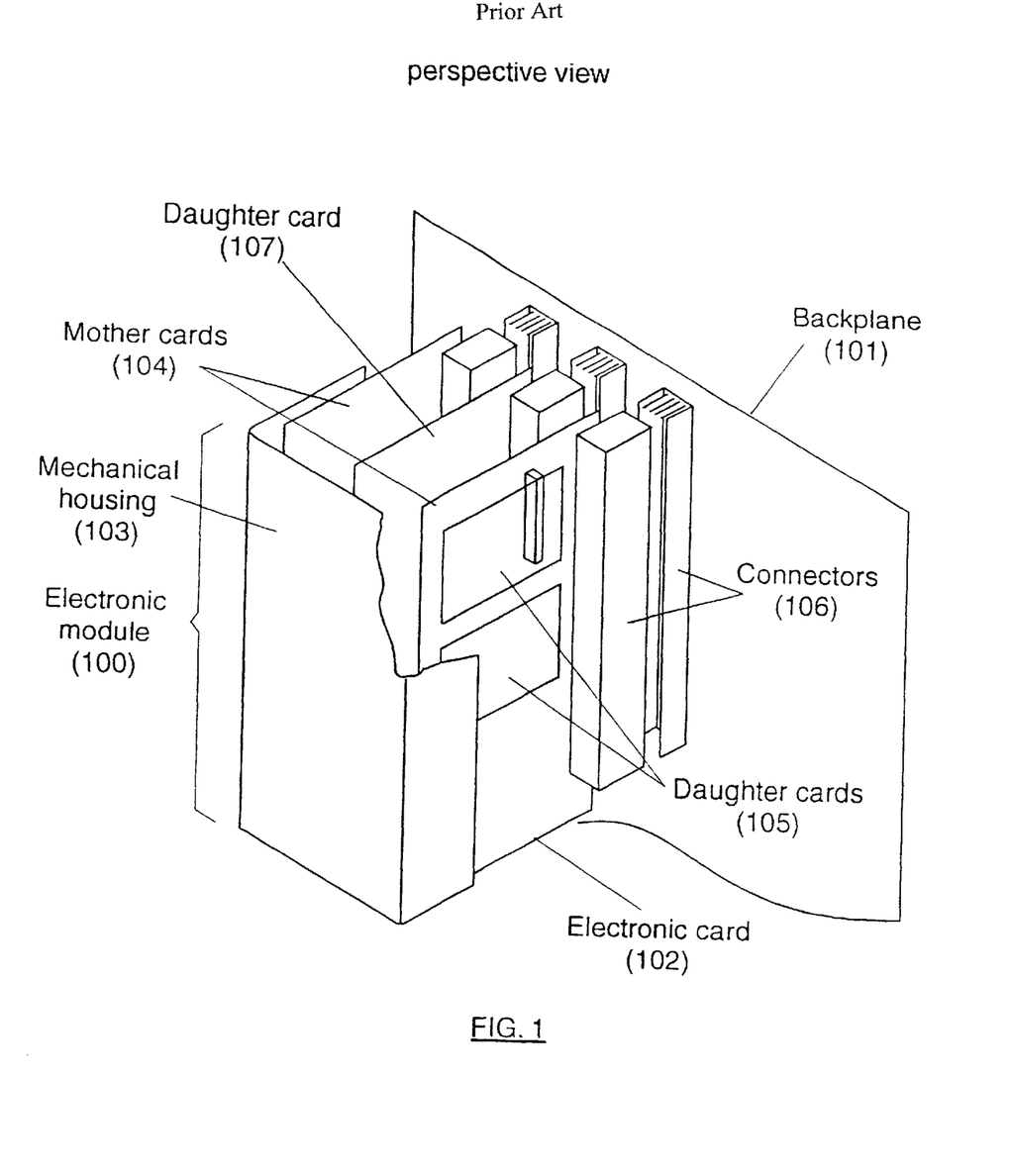
FIG. 1 is a perspective view of an electronic module comprising a plurality of cards connected to a backplane according to prior art.
Figure 2:
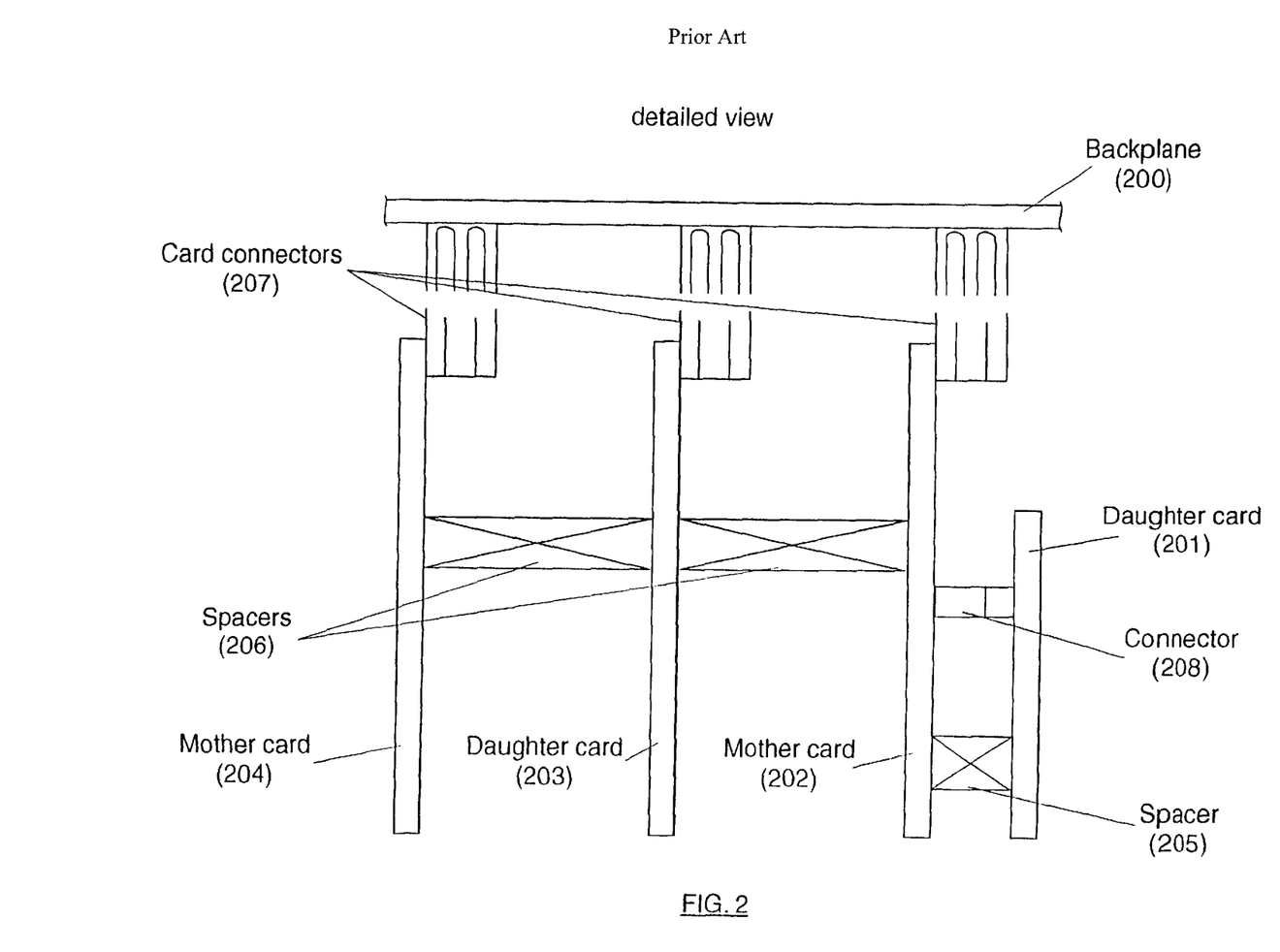
FIG. 2 is a detailed view of the mother and daughter cards.
Figure 3:
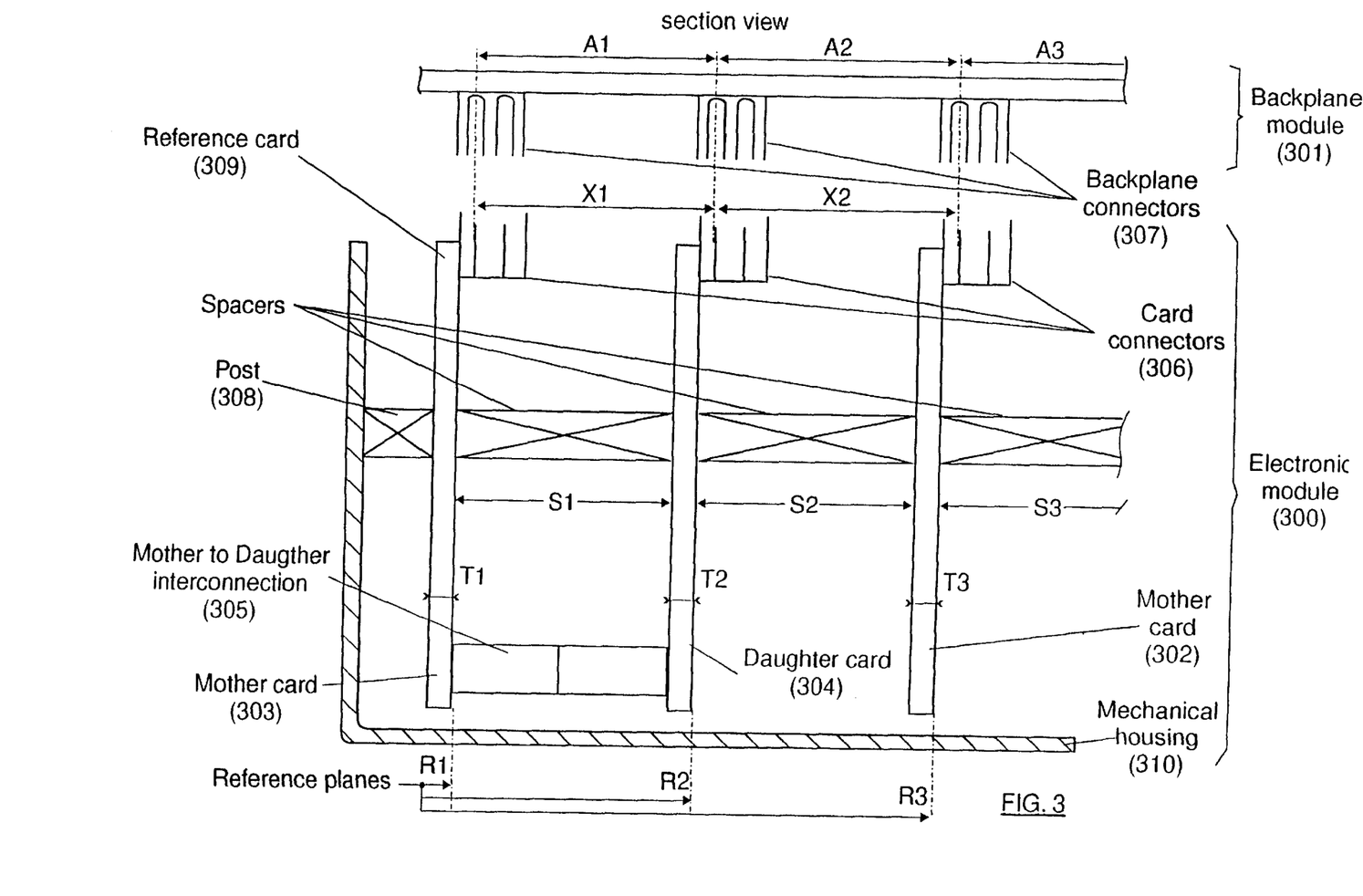
FIG. 3 is a section view of an electronic system according to prior art.

FIG. 1, FIG. 2 and FIG. 3 describe the background art related to electronic cards and backplane connectors.

FIG. 1 is a perspective view of an electronic module (100) comprising a plurality of cards (102) connected to a backplane (101) according to prior art. The electronic module (100) comprises a mechanical housing (103), one or more mother board cards (102) or Printed Circuit Boards (PCB). The mother cards (104) directly connected to the backplane, and daughter cards (105) connected to mother cards and/or directly to the backplane (107).

The backplane (101) comprises one or a plurality of connectors (106) for receiving said one or plurality of cards equipped with connectors. Mother cards (104) are connected peer to peer through the back plane. Daughter cards (105) are connected either internally on mother cards or directly through the back plane.

FIG. 2 is a section view of the system according to prior art showing two particular embodiments, the first being with the daughter card (201) directly plugged (via connector 208) on an associated mother card (202) which is connected to the backplane (200). The second embodiment comprises a daughter card (203) connected to its mother card through the backplane (200).

A set of spacers (205, 206) is installed between cards (201, 202, 203, 204) to guarantee the mechanical rigidity of the electrical module, the parallel positioning of the electronic cards, and the spacing between the card connectors (207).

FIG. 3 is a section view of the system described in FIG. 1. The electronic module (300) comprises within its mechanical housing (310), a plurality of electronic cards with connectors. Three cards are shown, mother cards (302, 303) and daughter card (304) plugged on mother card (303) by means of connector (305). Cards are stacked together using spacers (S1, S2, S3 . . . ). In general, the first card (303) is fastened to the housing (310) by means of one or a plurality of posts (308) or equivalent means. This first card is generally used as "reference card" (309) for positioning the other cards. The problem raised by the prior art is related to the plugging of the electronic module on the backplane (301) and more particularly to the alignment of the card connectors (306) with the backplane connectors (307) taking into account the mechanical tolerances of the various elements.

To evaluate the mechanical tolerance one can refer to FIG. 3 where the spacing between backplane connectors is defined by A1, A2, An, and the spacing between card connectors is defined by X1, X2, Xn. To simplify the description, it will be supposed that:

$$A1=A2=An$$

$$X1=X2=Xn$$

It will be also assumed that tolerances on connectors are insignificant and negligible (close to zero).

For aligning electronic cards connectors with backplane connectors, a reference card and reference planes must be defined. The first electronic card (303) can be defined as "reference card" (309) (in general, the card fastened to the housing is chosen as reference card). For each card, the side where the card connector is located is defined as "reference plane" (R1, R2, R3). There is one reference plane per card. The reference planes in a module comprising a plurality of cards are arranged parallel and are generally oriented towards the same direction. In prior art, the first spacer (S1) is fixed between the reference plane (R1) of the first card and the opposite side of the second card (304).

From a theoretical standpoint we have the following equations.

$$A1=X1, A2=X2, An=Xn$$

From an industrial and realistic standpoint, industrial tolerances of the various mechanical elements must be taken in account. The equation becomes:

$$X1_{min}<X1<X1_{max}$$

where $$X1_{min}=X1-x1 \text{ and } X1_{max}=X1+x1$$

with $$X1_{max}=S1_{max}+T2_{max}=(S1+s1)+(T2+t2)$$

$$X1_{min}=S1_{min}+T2_{min}=(S1-s1)+(T2-t2)$$

where:
S1, S2, Sn: dimension of spacers 1, 2, n
T1, T2, Tn: thickness of electronic cards (Printed Circuit Boards PCB) 1, 2, n
s1, s2, sn: tolerance on spacer dimension 1, 2, n
t1, t2, tn : tolerance on card thickness 1, 2, n $$S1_{max}=S1+s1$$

$$S1_{min}=S1-s1$$

$$T2_{max}=T2+t2$$

$$T2_{min}=T2-t2$$

The spacing tolerance on second card connector is equal to:

$$x1=s1+t2$$

For the third connector, the equation becomes:

$$X1_{min}+X2_{min}<X1+X2<X1_{max}+X2_{max}$$

with $$X1_{max}+X2_{max}=(S1_{max}+T2_{max})+(S2_{max}+T3_{max})$$

$$X1_{min}+X2_{min}=(S1_{min}+T2_{min})+(S2_{min}+T3_{min})$$

The spacing tolerance on third card connector is equal to:

$$x1+x2=s1+s2+t2+t3$$

The spacing tolerance on the connector of the nth electronic card is equal to:

$$x1+x2+\ldots+xn=(s1+s2+\ldots+sn)+(t2+t3+\ldots+t(n+1)).$$

The spacing and thickness tolerances are cumulative, they must be added with each additional card. It becomes more of a problem for systems using a larger number of electronic cards.

This problem can be illustrated with an example. The commercial tolerance for the spacing of the backplane connectors A1, A2, An is +/−0.025 mm and the tolerance range is 0.05 mm.

The regular industry thickness tolerance for a Printed Circuit Card (PCB) is 10% with a nominal tolerance of +/−5%. The current nominal thickness used nowadays in most industries for ongoing developments is 2.2 mm (+/− 0.11 mm).

The regular tolerance on commercial spacers S1, S2, Sn is +/−0.05 mm and the tolerance range is 0.1 mm. This tolerance is generally given in millimetres and is not function of the spacers length or dimension.

Applying numbers to the equations:

$$X1_{max}=(S1+0.5)+(T2+0.11)$$

x1 upper tolerance is 0.16 mm.

$$X1_{min}=(S1-0.05)+(T2-0.11)$$

x1 lower tolerance is 0.16 mm.
X1 tolerance is equal to +/−0.16 mm, and the tolerance range is 0.32 mm.

This result must be compared to the tolerance on the spacing between backplane connectors. If we call a1, a2, an: the tolerance on spacing between backplane connectors 1, 2, n and assume:

$$x1=0.32 \text{ mm}$$

$$a1=0.05 \text{ mm}$$

The ratio x1/a1 between tolerance is 6.4:

$$x1/a1=0.64 \text{ mm}$$

With such a ratio, trying to match an electronic module comprising two cards with a backplane will result in damaging connectors contacts. If the electronic module is upgraded with a third card, the situation will be worst because tolerances are cumulative. Thus, the analysis of tolerances shows the limit of the background art when cards stacked in a module have to be plugged at the same time into a backplane.

An alternative for aligning the electronic cards is to attach the cards to the housing body itself. At this point several technologies have to be addressed, such as sheet metal regularly used in the IT (Information Technology) industry, die-casting or full machining.

Considering sheet metal, this technology provide very affordable costs in terms of parts manufacturing, low cost material and tooling associated to minor post process actions such machining, but the problem is the tolerance strength. In facts this technology and the side technologies used to fasten or fix together several items (spot welding or riveting) do not provide the required precision for aligning electronic cards in order to connect at the same time one or more cards.

Considering other technologies such as die-casting or full machining (really not used in the IT industry), if the precision requirements can be achieved, in an economical point of view, these manufacturing processes are time and material consuming. As a result, if those technologies were to be used to produce the parts aimed to hold the electronic cards, the manufacturing cost would be so high that the solution would be abandoned.

SUMMARY OF THE INVENTION

The present invention relates to electronic systems such as computers or communication systems which need to achieve a maximum of connectivity using electronic cards for peer to peer connection through a backplane. The invention relates also to electronic modules connected to the backplane of the electronic systems and comprising more than one electronic card stacked in the mechanical housing of the electronic module. All these equipment have a need for a system for precisely positioning a plurality of cards with the aim of mating them exactly into a backplane. A further object of the invention is to provide this alignment of electronic cards even if some cards are missing or are not installed in the module they belong to.

The system for positioning the electronic cards comprises a linking axis for linking cards together comprising parts of different sections including at least one spacing element. It also comprises a reference plane associated to each card according to a predetermined position. The differences of section between the different parts of the linking axis form positioning shoulders aimed at being in contact with the reference planes of the cards. It also comprises maintaining pieces to maintain the reference plane of each card against the associated positioning means. Each card comprises a hole for inserting the linking axis and the surface element around the hole is in contact with the edge of the shoulder associated with the card. The reference planes are oriented towards a same direction. The linking axis is of increasing section, and this section is preferably round. The maintaining pieces comprise for each card a thread on the linking axis, and a nut screwed on the thread for pressing flat the reference plane of the card against the associated positioning elements. The positioning elements comprise in one end a head aimed at being in contact with the reference plane of a last card. The linking axis can be made of a single piece or of a plurality of different elements, each spacing two electronic cards, and in this case, the positioning elements comprise one head located at each end of said different element of said linking axis. Cards are arranged approximately parallel and aimed at being plugged perpendicularly to the back plane. The spacing between cards corresponds approximately to the spacing of the backplane connectors.

BRIEF DESCRIPTION OF THE DRAWINGS

The novel and inventive features believed characteristics of the invention are set forth in the appended claims. The invention itself, however, as well as a preferred mode of use, further objects and advantages thereof, will best be understood by reference to the following detailed description of an illustrative detailed embodiment when read in conjunction with the accompanying drawings, wherein:

PREFERRED EMBODIMENT OF THE INVENTION

The present invention consists of a system for plugging at the same time the connectors of a plurality of cards (mother and daughter(s) cards) into a backplane. Mother and daughter(s) cards are part of a single subset called electronic module including cards, mechanical housing and an alignment system. One problem in achieving such an electronic module concerns the industrial tolerance on Printed Circuit Boards (PCB) and more particularly the tolerance for the thickness of these PCBs. An electronic module is basically made of a stack of electronic cards, each stack adding to the overall the PCB tolerance. For large modules with many cards, a connectors mismatch between the electronic cards and the backplane can exist. The pitch positioning of connectors on the backplane is given by drilling holes with a high precision drilling machine. The pitch positioning of connectors of the electronic cards within the electronic module is given for a set of spacers. The alignment system according to the present invention provides non cumulative PCB tolerance.

Figure 4:
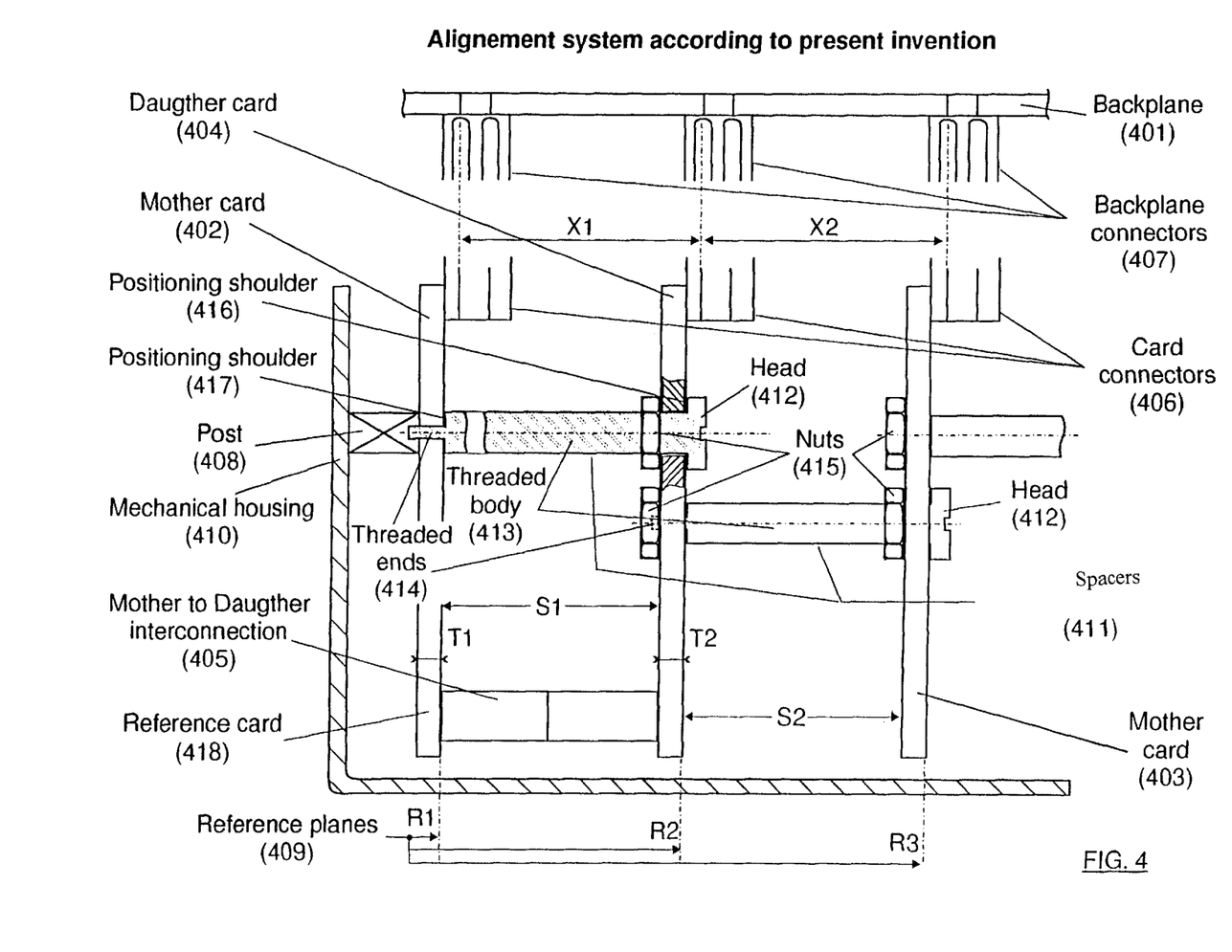
FIG. 4 shows a mechanical system of aligning and plugging a plurality of electronic cards into a backplane according to the present invention.

A first embodiment of the invention is shown in FIG. 4 showing a section view of an electronic equipment comprising the alignment system according to the present invention. The electronic module (400) comprises within its mechanical housing (410), a plurality of electronic cards with connectors. Three cards are shown, mother cards (402, 403) and daughter card (404) plugged on mother card (403) by means of connector (405). In general, the first card (403) is fastened to the housing (410) by means of one or a plurality of posts (408) or equivalent means. This first card is generally used as "reference card" (418) for positioning the other cards. Cards are stacked together using spacers (S1, S2, S3 . . . ). These spacers (411) are designed for aligning the card connectors (406) with the backplane (401) connectors (407) independently of the mechanical tolerance on card thickness (T1, T2, T3, . . . ).

In a preferred embodiment, spacers are identical. They comprise an item like a shoulder screw, made of a body (413) preferably cylindrical with a head (412) and a end of a smaller section (smaller diameter) (414) and fastening means for maintaining the electronic cards (415). An example of spacer is illustrated in FIG. 4. Spacer S1 between mother card (402) and daughter card (404) has four features which are a main body, a end of the smaller section, a head and fastening pieces.

The body (413) is the part linking the cards together. The body comprises elements of different sections forming a succession of stair steps or shoulders (the terms stair step or shoulder will be used interchangeably). A first positioning shoulder (417) is aimed at being in contact with the reference plane (R1) of the first card (402) and a second positioning shoulder (416) is aimed at being in contact with the reference plane (R2) of the second card (404), both electronic cards being maintained approximately parallel, the reference planes (R1, R2) being oriented towards the same direction.

The body comprises an end of a smaller section. The difference of section between the body itself and the end of the body forms a kind of stair step or shoulder. This first positioning shoulder (417) at this end of the body is aimed at being pressed flat against the reference plane (R1) of the first card (402).

The head (412) can be slotted or hexagonal or any other shape that permits assembly and tightening purpose. The head forms a second positioning shoulder (416) aimed at being pressed flat against the reference plane (R2) of the second card (404).

In a preferred embodiment, the body (413) is threaded at both ends for installing nuts (415). Shoulders are used for positioning the electronic cards. Nuts are the fastening pieces used for fastening and maintaining the electronic cards and more particularly for pressing flat the reference planes (R1 and R2) of the electronic cards (402 and 404) against the edge of the positioning shoulders (416, 417). The thread under the head (412) is made of the main body diameter, the opposite threaded end (414) is made of a smaller diameter.

The electronic cards are bored so that threaded ends of the spacer can be inserted and secured to the cards using the nuts. The size of the hole in each card is so that the surface element around the hole—on the side of the reference plane—can be pressed flat against the corresponding positioning shoulder edge by means of the nut installed at the opposite side of the card.

In the embodiment illustrated in FIG. 4 the hole bored in the first card (402) is larger than the section of the threaded end (414) of the spacer and smaller than the section (diameter) of the main body (413) of this same spacer. In FIG. 4 also, the hole bored in the second card (404) is larger than the section (diameter) of the main body (413) of the spacer and smaller than the head (412) of this same spacer.

With the card (or Printed Circuit Card PCB) alignment mechanism of the preferred embodiment:

$$X1_{max} = S1_{max}$$

$$X1_{min} = S1_{min}$$

It is assumed that the tolerances on connector sizes are not significant (close to zero). In our example, mother card (402) is used as reference card.

From an industrial and realistic standpoint, industrial tolerances of the various mechanical elements must be taken in account. The equation becomes:

$$X1 - x1 = X1_{min} < X1 < X1_{max} = X1 + X1$$

with $$X1_{max} = S1_{max} = S1 + s1$$

$$X1_{min} = S1_{min} = S1 - s1$$

where:

S1, S2, Sn: dimension of spacers 1, 2, n s1, s2, sn: tolerance on spacer dimension 1, 2, n $$S1_{max} = S1 + s1$$

$$S1_{min} = S1 - s1$$

The spacing tolerance on second card connector is equal to:

$$x1=s1$$

For the third connector, the equation becomes:

$$X1_{min}+X2_{min}<X1+X2<X1_{max}+X2_{max}$$

with $$X1_{max}+X2_{max}=S1_{max}+S2_{max}$$

$$X1_{min}+X2_{min}=S1_{min}+S2_{min}$$

The spacing tolerance on third card connector is equal to:

$$x1+x2=s1+s2$$

The spacing tolerance on the connector of the nth electronic card is equal to:

$$x1+x2+\ldots+xn=s1+s2+\ldots+sn$$

The thickness of cards (T1, T2, T3, . . . ) has no more to be taken into account and the overall tolerance is significantly reduced.

Note that if $s1=s2=s3=\ldots=sn=s$, the expression becomes:

$$x1+x2+\ldots+xn=n*s$$

where n is the number of cards comprised in the module (the reference card not being counted).

For example, if X1 tolerance is equal to +/−0.05 mm compared to a previous X1 tolerance equal to +/−0.16 mm. The tolerance is decreased to a ratio equal to 3.2:

$$x1=0.1 \text{ mm}$$

$$a1=0.05 \text{ mm}$$

Because the positioning of the electronic cards is independent of the card thickness, a second saving is achieved by increasing the PCB thickness up to 15%. This results in lower cost.

Figure 5:
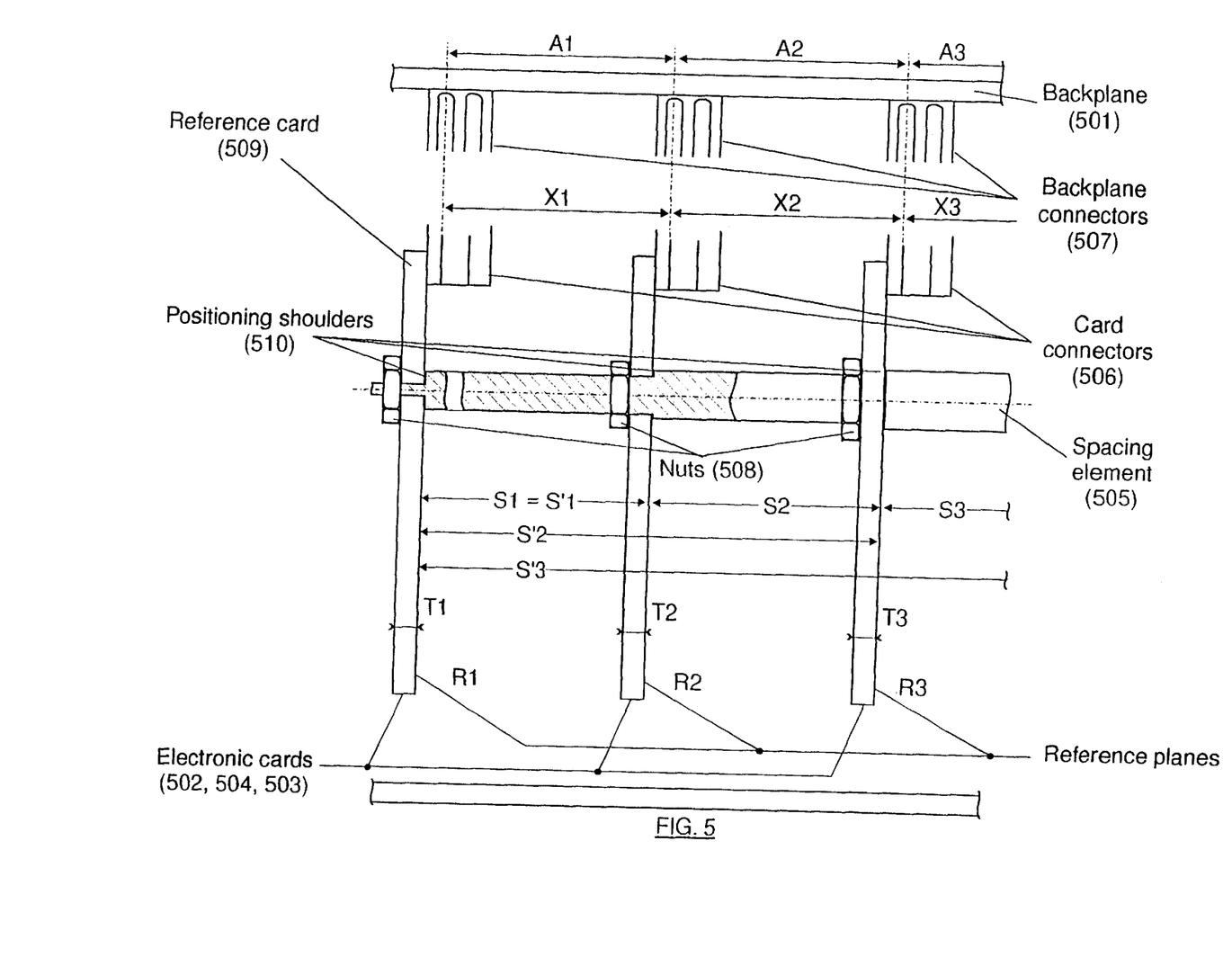
FIG. 5 shows a particular embodiment of the present invention.

FIG. 5 illustrates a second embodiment of the invention, it is a section view of an electronic equipment alignment system. The spacers (S1, S2, S3 . . . ) used in the previous embodiment for positioning and maintaining the electronic cards (502, 503, 504) together, are replaced by a single spacing element. This spacing element is designed for mating the electronic cards (506) on the backplane (501, 507) connectors (507) independently of the mechanical tolerance on card thickness (T1, T2, T3, . . . ) And of the cumulative tolerance on cards spacers (S1, S2, S3 . . . ).

As illustrated in FIG. 5, the spacing element (505) is made of a body comprising a succession of spacers (S1, S2, S3 . . . ) of increasing section. Spacers are arranged end to end and are preferably cylindrical but may be conical portions. The difference of section (diameter) between two successive spacers forms a kind of stair step or shoulder. These successive shoulders (510) are aimed at positioning the electronic cards (502, 504, 503) parallel, with a predetermined spacing corresponding to the spacing of the backplane connectors (507). Fasteners (508) are associated to the shoulders (510) for maintaining the relative position of the electronic cards (502, 504, 503). The spacing element (505) comprises linking elements, positioning elements and fastening pieces.

The body (505) is the part linking the cards together. It comprises parts of different sections including at least one spacer.

The body comprises successive positioning shoulders (510) aimed at being in contact with the reference plane (R1, R2, R3) of the electronic cards (502, 504, 503), electronic cards being positioned approximately parallel and reference planes oriented towards the same direction.

In a preferred embodiment, the body (505) is threaded for installing nuts (508). These nuts are screwed on the spacing element for fastening the electronic cards and more particularly for pressing flat the reference planes (R1, R2, R3) of the electronic cards (502, 504, 503) against the edge of the positioning shoulders (510).

The electronic cards are bored so that the spacing element (505) can be inserted and the nuts (508) screwed. The size of the hole in each card is so that the surface element around the hole—on the side of the reference plane—can be pressed flat against the corresponding shoulder edge (510) by means of the nut (508) installed at the opposite side of the card. In the example illustrated in FIG. 5 the hole bored in the second card (504) is larger than the section (diameter) of spacer SI and smaller than the section (diameter) of next spacer S2. One can see also in FIG. 5 that the hole bored in the third card (503) is larger than the section (diameter) of spacer S2 and smaller than the section (diameter) of next spacer S3.

The spacing element can be made of a single piece. It can also be made of a plurality of spacers screwed end to end depending on the number of electronic cards comprised in the module.

With the card (or Printed Circuit Card PCB) alignment system illustrated in FIG. 5, the equations detailed in the first embodiment for mechanical tolerance evaluation become:

$$X1_{max}=S1_{max}$$

$$X1_{min}=S1_{min}$$

It is assumed that the tolerances on connector sizes are not significant (close to zero). In our example, card (502) is used as reference card (509).

The spacing tolerance on second card connector is equal to:

$$x1=s1=s1'$$

For the third connector, the equation becomes:

$$X1_{min}+X2_{min}<X1+X2<X1_{max}+X2_{max}$$

with $$X1_{max}+X2_{max}=S2'_{max}$$

$$X1_{min}+X2_{min}=S2'_{min}$$

The spacing tolerance on third card connector is equal to:

$$x1+x2=s2'$$

The spacing tolerance on the connector of the nth electronic card is equal to:

$$x1+x2+\ldots+xn=sn'$$

The thickness of cards (T1, T2, T3, . . . ) No longer has to be taken into account. Furthermore, because the tolerance on the spacing element is not a function of its length, the overall tolerance on the different spacers is no more cumulative and is consequently significantly reduced.

For a numerical application of the mechanical tolerances calculation we have the X1 tolerance equal to +/−0.05 mm. Compared with the X1 tolerance of the first embodiment, the tolerance remains unchanged. X1 tolerance range is 0.1 mm. The X2 tolerance is equal to +/−0.05 mm. Compared with the X2 tolerance of the first embodiment equal to +/−0.1 mm, the tolerance is decreased to a ratio equal to 2. X2 tolerance range is 0.2 mm. The Xn tolerance is still equal to +/−0.05 mm. Compared with the Xn tolerance of the first embodiment equal to +/−n. 0.05 mm, the tolerance is decreased to a ratio equal to n. Xn tolerance range is n. 0.1 mm.

Because the positioning of the electronic cards is independent of the number of cards, a third saving is achieved by releasing the tolerance on the spacing element. This results in lower cost. Furthermore, the present system allows the alignment of a plurality of cards even if some cards are missing or are not installed in the module.

While the invention has been particularly shown and described with reference to a preferred embodiment, it will be understood that various changes in form and detail may be made therein without departing from the spirit, and scope of the invention.

What is claimed is:

1. An electronic module comprising:
    a mechanical housing;
    a plurality of stacked electronic cards located in said mechanical housing, one of said plurality of electronic cards being posted to said mechanical housing by a posting part, said plurality of electronic cards having connectors located on a first side of each card, said first side defining a reference plane associated with said card;
    at least one linking element having parts of different sections, each of said at least one linking element linking two cards of the plurality of electronic cards together;
    shoulders being formed by the differences of section between the different parts of said at least one linking element and aiming at being in contact with said each reference plane;
    maintaining pieces for maintaining the reference plane of each of said plurality of electronic cards against the shoulders of said at least one linking element.

2. The electronic module of claim 1 wherein each of said plurality of electronic cards comprises at least one hole for inserting one part of one linking element it is connected to.

3. The electronic module of claim 2 wherein the surface element around each said electronic card hole is in contact with the edge of the shoulder of the linking elements it is linked to.

4. The electronic module according to claim 3 wherein the reference planes are oriented towards a same direction.

5. The electronic module according to claim 4 wherein the different parts of said at least one linking element have an increasing section.

6. The electronic module according to claim 5 wherein said at least one linking element has a round section and said maintaining pieces comprise for each of said plurality of electronic cards:
    a thread on the linking element;
    a nut screwed on said thread for pressing flat the reference plane of the electronic card against the shoulders of the linking element.

7. The electronic module of claim 6 wherein each of said at least one linking element comprises in one end a head aimed at being in contact with one side of the reference plane of the card it is linked to, the other side of the reference plane being in contact with a shoulder.

8. An electronic module comprising:
    a mechanical housing;
    a plurality of stacked electronic cards located in said mechanical housing, one of said plurality of electronic cards being posted to said mechanical housing by a posting part, said plurality of electronic cards having connectors located on a first side of each card, said first side defining a reference plane associated with said card;
    one linking element having parts of different sections, said linking element linking said plurality of electronic cards together;
    shoulders being formed by the differences of section between the different parts of said linking element and aiming at being in contact with said each reference plane;
    maintaining pieces for maintaining the reference plane of each of said plurality of electronic cards against the shoulders of the linking element.

9. The electronic module of claim 8 wherein each of said plurality of electronic cards comprises one hole for inserting one part of the linking element.

10. The electronic module of claim 9 wherein the surface element around each said electronic card hole is in contact with the edge of the shoulder of the linking element.

11. The electronic module according to claim 10 wherein the reference planes are oriented towards a same direction.

12. The electronic module according to claim 11 wherein the different parts of said linking element have an increasing section.

13. The electronic module according to claim 12 wherein said linking element has a round section and said maintaining pieces comprise for each of said plurality of electronic cards:
    a thread on the linking element;
    a nut screwed on said thread for pressing flat the reference plane of the electronic card against the shoulders of the linking element.

14. The electronic module of claim 13 wherein said linking element comprises in one end a head aimed at being in contact with one side of the reference plane of the card, the other side of the reference plane being in contact with a shoulder.

15. The electronic module of claim 14 wherein said linking element can be made of a single piece or of a plurality of different pieces screwed end to end.

16. An electronic system comprising:
    at least one electronic module comprising:
        a mechanical housing;
        a plurality of stacked electronic cards located in said mechanical housing, one of said plurality of electronic cards being posted to said mechanical housing by a posting part, said plurality of electronic cards having connectors located on a first side of each card, said first side defining a reference plane associated with said card;
        at least one litking element having parts of different sections, each of said at least one linking element linking two cards of the plurality of electronic cards together;
        shoulders being formed by the differences of section between the different parts of said at least one linking element and aiming at being in contact with said each reference plane;

maintaining pieces for maintaining the reference plane of each of said plurality of electronic cards against the shoulders of the at least one linking element;

said electronic system further comprises a backplane having connectors for plugging said plurality of electronic cards, using said electronic card connectors, said backplane providing the wired connections necessary to allow peer to peer connection between said electronic cards once plugged therein.

17. The electronic system of claim 16 wherein each of said plurality of electronic cards comprises at least one hole for inserting one part of one linking element it is connected to.

18. The electronic system of claim 17 wherein the surface element around each said electronic card hole is in contact with the edge of the shoulder of the linking elements it is linked to.

19. The electronic system according to claim 18 wherein the reference planes are oriented towards a same direction.

20. The electronic system according to claim 19 wherein the different parts of said at least one linking element have an increasing section.

21. The electronic system according to claim 20 wherein said at least one linking element has a round section and said maintaining pieces comprise for each of said plurality of electronic cards:
   a thread on the linking element;
   a nut screwed on said thread for pressing flat the reference plane of the electronic card against the shoulders of the linking element.

22. The electronic system of claim 21 wherein each of said at least one linking element comprises in one end a head aimed at being in contact with one side of the reference plane of the card it is linked to, the other side of the reference plane being in contact with a shoulder.

23. The electronic system according to claim 22 wherein said cards are arranged approximately parallel and aimed at being plugged perpendicularly to the backplane.

24. The electronic system according to claim 23 wherein the spacing between cards corresponds approximately to the spacing of the backplane connectors.

25. An electronic system comprising:
   at least one electronic module comprising:
      a mechanical housing;
      a plurality of stacked electronic cards located in said mechanical housing, one of said plurality of electronic cards being posted to said mechanical housing by a posting part, said plurality of electronic cards having connectors located on a first side of each card, said first side defining a reference plane associated with said card;
      one linking element having parts of different sections, said linking element linking said plurality of electronic cards together;
      shoulders being formed by the differences of section between the different parts of said linking element and aiming at being in contact with said each reference plane;
      maintaining pieces for maintaining the reference plane of each of said plurality of electronic cards against the shoulders of the linking element;

said electronic system further comprises backplane having connectors for plugging said plurality of electronic cards, using said electronic card connectors, said backplane providing the wired connections necessary to allow peer to peer connection between said electronic cards once plugged therein.

26. The electronic system of claim 25 wherein each of said plurality of electronic cards comprises a hole for inserting one part of the linking element.

27. The electronic system of claim 26 wherein the surface element around each said electronic card hole is in contact with the edge of the shoulder of the linking element.

28. The electronic system according to claim 27 wherein the reference planes are oriented towards a same direction.

29. The electronic system according to claim 28 wherein the different parts of said linking element have an increasing section.

30. The electronic system according to claim 29 wherein said linking element has a round section and said maintaining pieces comprise for each of said plurality of electronic cards:
   a thread on the linking element;
   a nut screwed on said thread for pressing flat the reference plane of the electronic card against the shoulders of the linking element.

31. The electronic system of claim 30 wherein said linking element comprises in one end a head aimed at being in contact with one side of the reference plane of the card, the other side of the reference plane being in contact with a shoulder.

32. The electronic system of claim 31 wherein said linking element can be made of a single piece or of a plurality of different pieces screwed end to end.

33. The electronic system according to claim 32 wherein said cards are arranged approximately parallel and aimed at being plugged perpendicularly to the backplane.

34. The electronic system according to claim 33 wherein the spacing between cards corresponds approximately to the spacing of the backplane connectors.

* * * * *